United States Patent [19]

Jaskolski et al.

[11] 3,971,056
[45] July 20, 1976

[54] SEMICONDUCTOR TEMPERATURE SWITCHES

[75] Inventors: Stanley V. Jaskolski, Sussex; Robert W. Lade, Waukesha; Herman P. Schutten, Elm Grove; Gordon B. Spellman, Milwaukee; Lawrence E. Van Horn, Greendale, all of Wis.

[73] Assignee: Cutler-Hammer, Inc., Milwaukee, Wis.

[22] Filed: Feb. 18, 1975

[21] Appl. No.: 550,838

[52] U.S. Cl. ................................... 357/28; 357/38; 357/39; 307/305; 307/310; 307/252 B; 307/252 H; 318/221 H
[51] Int. Cl.² .................. H01L 23/56; H01L 29/74; H03K 3/35; H02P 1/44
[58] Field of Search .................. 357/28, 37, 38, 39; 307/305, 310, 252 B, 252 H

[56] References Cited
UNITED STATES PATENTS

| 3,079,484 | 2/1963 | Shockley et al. | 357/28 |
| 3,166,680 | 1/1965 | Kevane et al. | 357/28 |

OTHER PUBLICATIONS
"Germanium Power Switching Devices" – Philips et al. – IRE Transactions on Electron Devices, vol. ED-5, pp. 13–18, Jan., 1958.

"Temp. Variation of Parameters of SCR" – Raderecht et al., Jour. of Electronic Control, vol. 17, No. 10, pp. 145–147, (London) 1964.

"Temp. Dependence of Static Turn-on Current of Thyristors" – Dumanevich et al., Physics of PN Junctions & Semiconductors (U.S.S.R), pp. 137–141 (1971).

*Primary Examiner*—Edward J. Wojciechowicz
*Attorney, Agent, or Firm*—Hugh R. Rather; William A. Autio

[57] ABSTRACT

Germanium semiconductor temperature switches are described which are capable of intrinsically switching between high and low resistance states within a temperature range up to 55°C, and are adapted for operating at voltages up to 400 volts. These temperature switches are disclosed in various configurations. Basic circuits for adjusting the temperatures at which such switches switch within a range are disclosed. Preferred methods of making the same are also disclosed.

45 Claims, 36 Drawing Figures

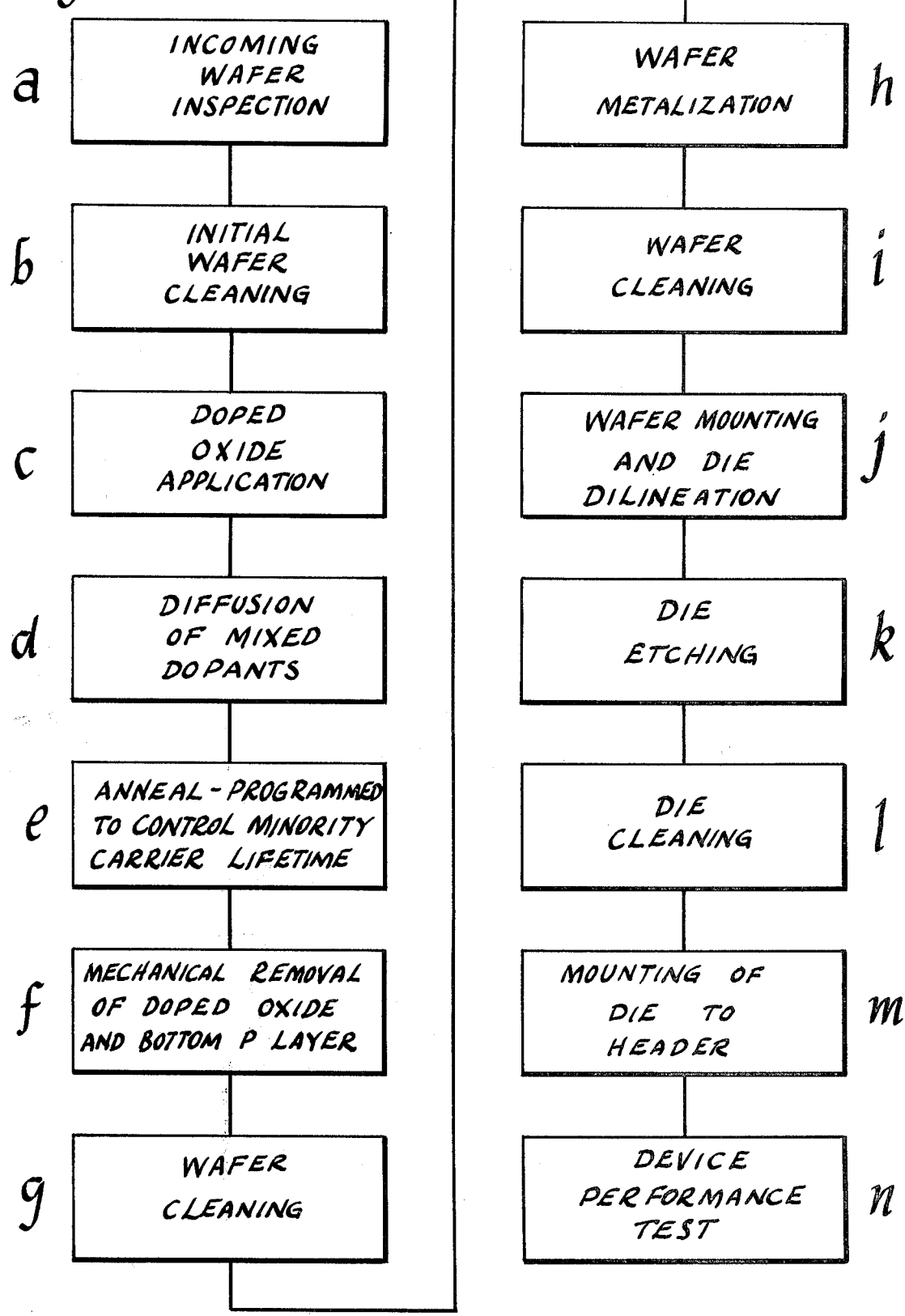

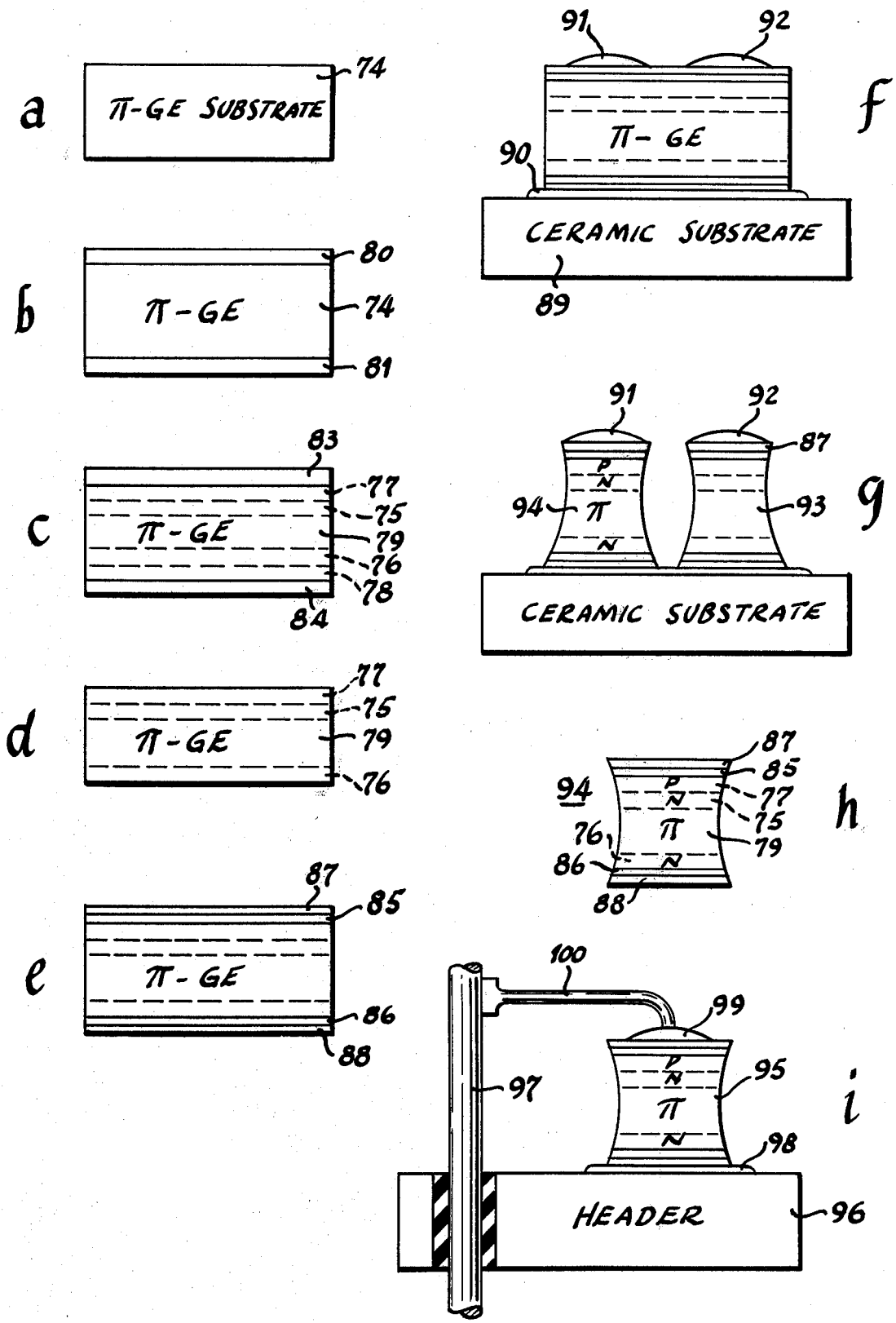

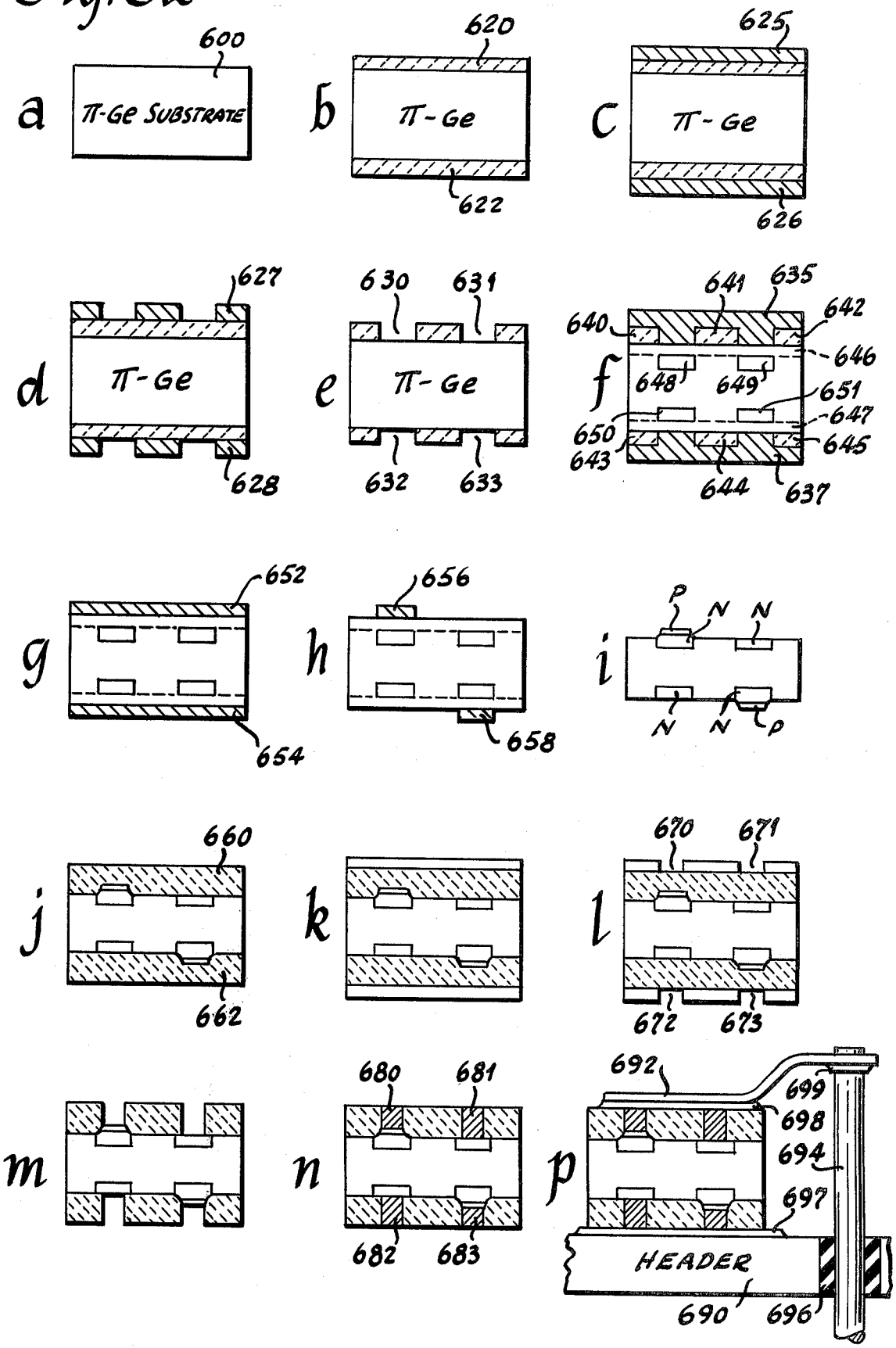

SEMICONDUCTOR TEMPERATURE SWITCHES

BACKGROUND OF THE INVENTION

Heretofore, most devices capable of switching between high and low resistance states have depended for their control upon signals provided by separate sensing elements in the circuit containing the device. In the case of semiconductor switches, it is usually the practice to employ a separate temperature responsive element in circuit therewith to initiate the switching of the semiconductor between its high and low resistance states upon attainment of a given temperature. The semiconductor switches most frequently used are thyristors, such as semiconductor controlled rectifiers (SCR's) or Triacs.

The possibility of using temperature to control the switching of SCR's and related devices directly has been known for some time as disclosed in the Shockley et al Pat. No. 3,079,484, issued Feb. 26, 1963, and Kevane et al Pat. No. 3,166,680, issued Jan. 19, 1965. However, to date there have been few practical uses for such teachings, principally because the development of semiconductor devices has been in the direction of preventing intrinsic switching below very high temperatures.

OBJECTS OF THE INVENTION

This invention relates to semiconductor switches and more particularly to such switches which are capable of switching from high to low resistance states at predetermined temperatures.

It is a primary object of the present invention to provide improved semiconductor temperature responsive switches.

Another object of the invention is to provide switches of the aforementioned type which are capable of switching at temperatures from below room temperature and up to temperatures above room temperature.

A further object of the invention is to provide switches of the aforementioned type which can be used for directly controlling the energization and de-energization of equipments used in domestic, commercial, and industrial environments, such as freezers, refrigerators, air conditioners and temperature control baths without need of additional temperature sensing devices and attendant circuitry.

A still further object of the invention is to provide basic control circuitry for the aforementioned switches whereby their temperatures of switching can be adjusted or preselected as desired.

Other objects and advantages of the invention will hereinafter appear.

SUMMARY OF THE INVENTION

According to the present invention a four layer semiconductor temperature responsive switch (STS) is fabricated using such materials and processes that it is capable of switching between high and low resistance states at a predetermined temperature according to the resistivities, carrier lifetimes, dimensions and number of the individual semiconductor layers which form part of the device. A family of such STS switches is shown and described.

Another aspect of the invention is the provision of suitable circuits wherein control methods can be implemented by the attachment of such circuits to two or more of the electrodes of the aforementioned STS switches so that desired switching temperatures can be adjusted over a predetermined range of temperatures.

BRIEF DESCRIPTION OF THE DRAWING FIGURES

FIG. 7 is a flow diagram of one complete preferred fabrication process for making the semiconductor elements of FIG. 2.

FIG. 8 depicts the various intermediate states of the semiconductor elements achieved in following the process steps of FIG. 7.

Figure 16:
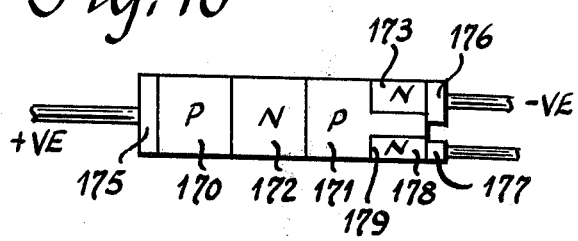

FIG. 16 schematically depicts a fourth form of STS constructed in accordance with the invention.

Figure 17:
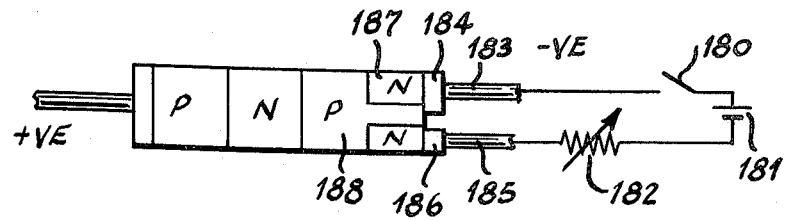

FIG. 17 depicts the STS of FIG. 16 together with a control circuit therefor.

Figure 18:
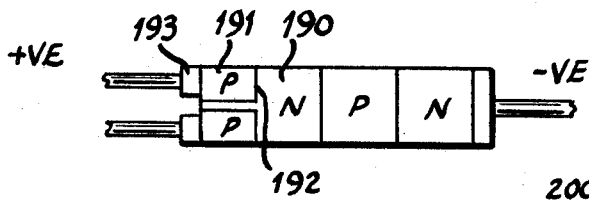

FIG. 18 schematically depicts a fifth form of a STS constructed in accordance with the invention.

Figure 19:
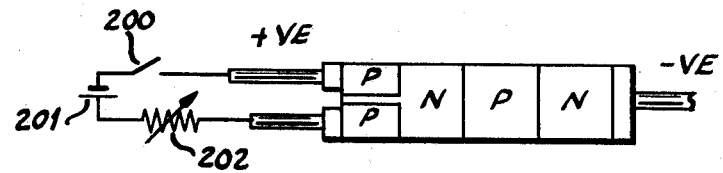

FIG. 19 depicts the STS of FIG. 18 together with a control circuit therefor.

Figure 20:
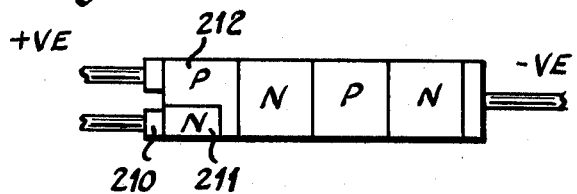

FIG. 20 schematically depicts a sixth form of STS constructed in accordance with the invention.

Figure 21:
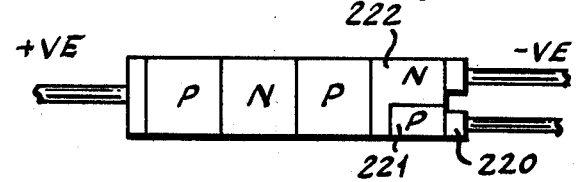

FIG. 21 schematically depicts a seventh form of STS constructed in accordance with the invention.

Figure 22:
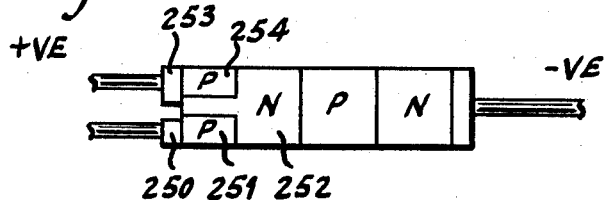

FIG. 22 schematically depicts an eighth form of STS constructed in accordance with the invention.

Figure 23:
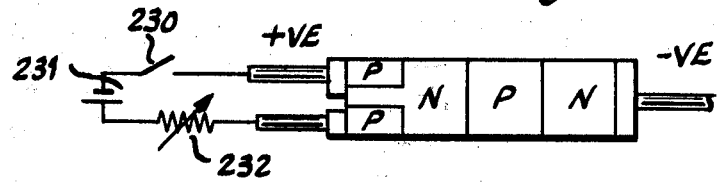

FIG. 23 depicts the STS of FIG. 22 together with a control circuit therefor.

Figure 24:
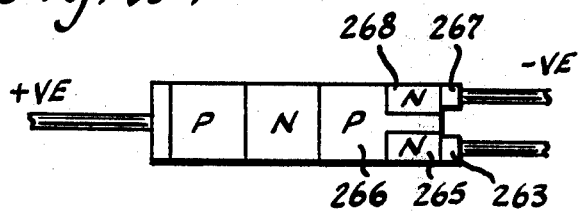

FIG. 24 schematically depicts a ninth form of STS constructed in accordance with the invention.

Figure 25:
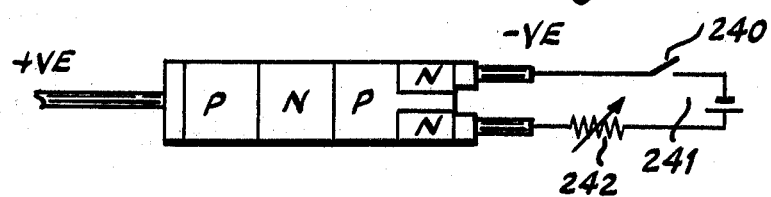

FIG. 25 depicts the STS of FIG. 24 together with a control circuit therefor.

Figure 26:
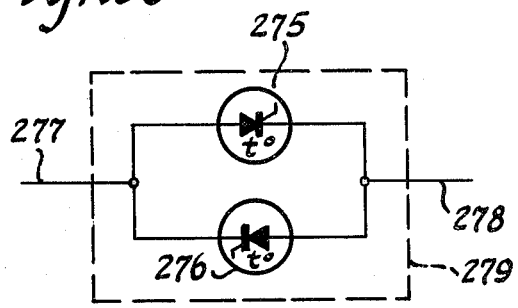

FIG. 26 schematically depicts a pair of unilateral STS's connected together to provide bilateral current conduction.

Figure 27:
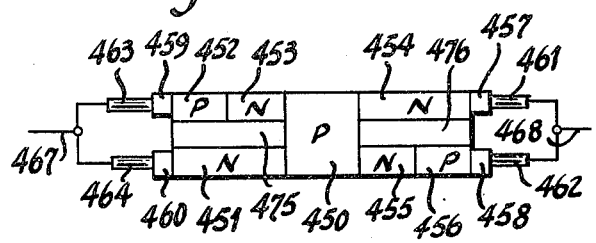

FIG. 27 schematically depicts the details of a bilateral STS constructed in accordance with the invention.

Figure 28:
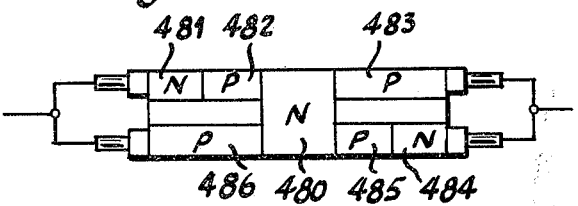

FIG. 28 depicts another form of bilateral STS constructed in accordance with the invention.

Figure 29:
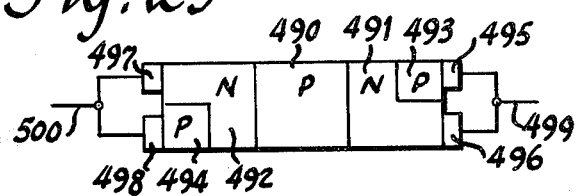

FIG. 29 depicts still another form of bilateral STS constructed in accordance with the invention.

Figure 30:
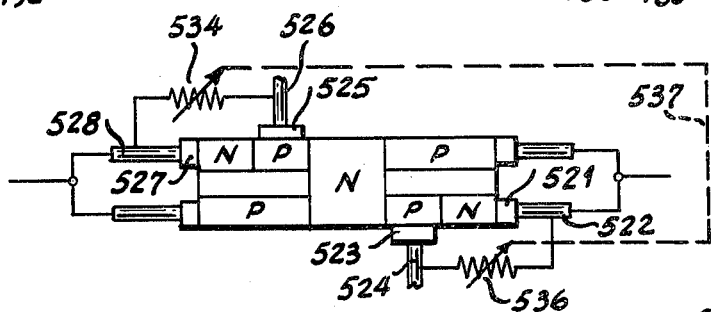

FIG. 30 depicts a modified form of the STS depicted in FIG. 28 together with a control circuit therefor.

Figure 31:
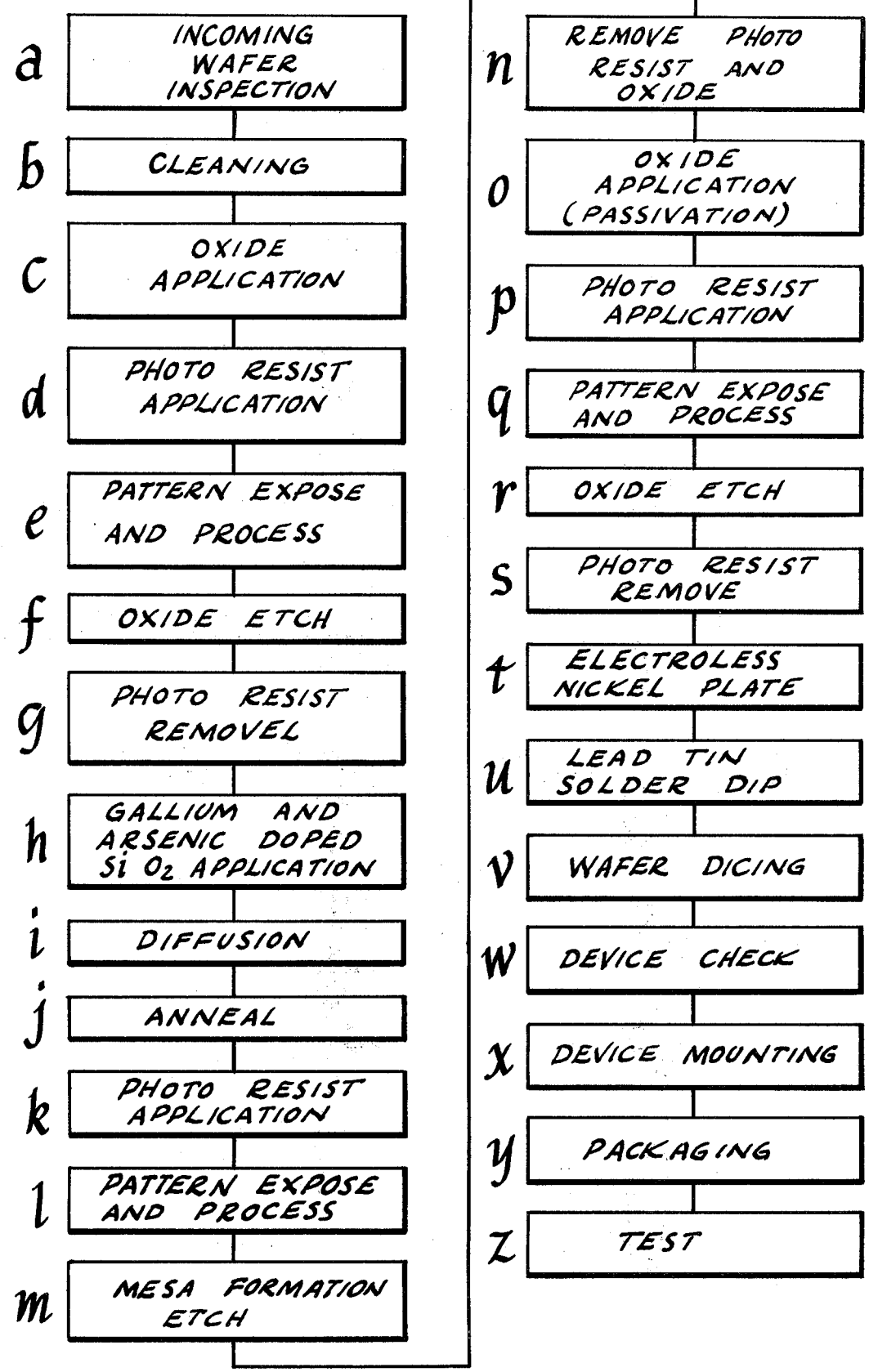

FIG. 31 is a flow diagram of a preferred fabrication process for making a bilateral STS of the present invention.

FIG. 32 depicts the various intermediate states of the bilateral achieved in following the process steps of FIG. 30.

Figure 33:
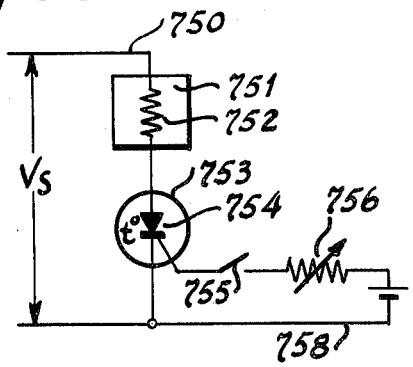

FIG. 33 schematically depicts a uni-lateral gate-controlled STS of the present invention in an energizing control circuit for an electric motor.

Figure 34:
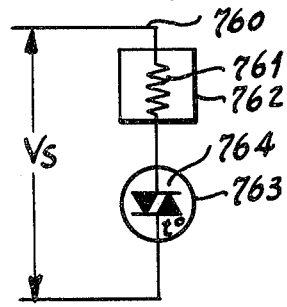
Figure 35:
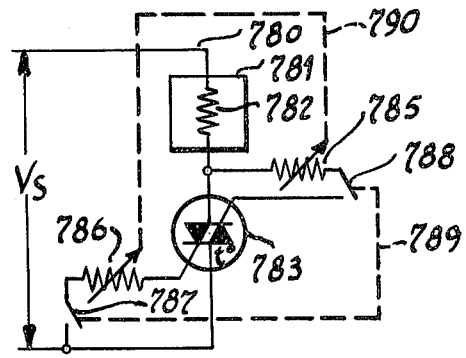

FIG. 34 schematically depicts a bilateral STS in the energizing control circuit for an electric motor, and FIG. 35 schematically depicts a gate controlled bilateral STS in an energizing control circuit for an electric motor.

DESCRIPTION OF THE PREFERRED EMBODIMENTS

Figure 1:
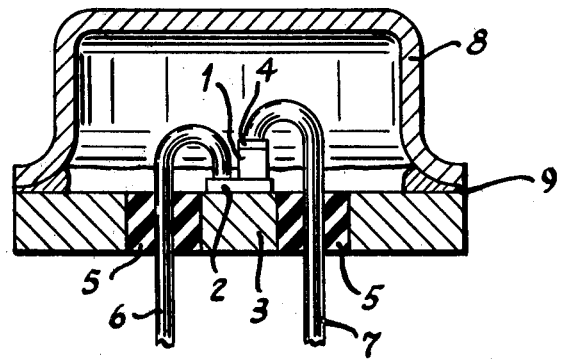
FIG. 1 is a view in vertical cross-section of a semiconductor temperature switch constructed in accordance with the invention.

FIG. 1 shows a temperature-responsive semiconductor temperature switch (STS) 1 in a package consisting of a base 3 with means to allow leads 6 and 7 to enter through electrically insulating bushing 5 so that lead 6 may be attached to contact plate 2 and lead 7 attached to contact plate 4, both contact plates being attached to the device 1. The package is completed by the lid 8 which is sealed by suitable means 9 to the base 3. The metal contacts 2 and 4 can be any of the contact materials known to those skilled in the art such as nickel, tin, aluminum, gold, indium, or alloys such as gold-aluminum, gold-rhodium, etc. The lid 8 and the base 3 can be any of the conventionally used materials known to those skilled in the art such as metals, plastics, glasses, and ceramics. The electrically insulating bushings 5 can also be any of the conventionally used materials known to those skilled in the art such as glass-to-metal seals, and the seal 9 can be any of the seals commonly known to those skilled in the art such as solder, a brazed joint, or a glass-to-metal seal.

Figure 2:
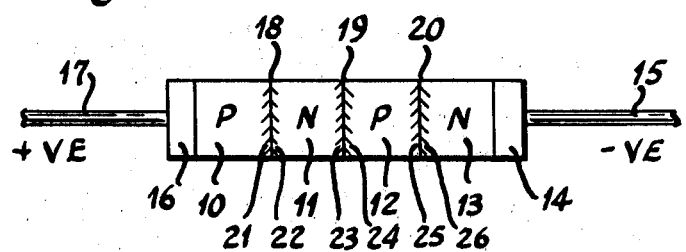
FIG. 2 is a schematic showing one form of semiconductor element used in the switch of FIG. 1.

The STS 1 is shown in more detail in a simple form in FIG. 2. It consists of a germanium semiconducting element with four layers of alternating electrical conductivity, layers 10 and 12 in the embodiment shown in FIG. 2 being of p-type germanium and layers 11 and 13 being of n-type germanium. A metal contact 16 is attached to layer 10 and a second metal contact 14 is attached to layer 13. Both these contacts are ohmic. The leads 15 and 17 are bonded to these metal contacts in any suitable manner. Those skilled in the art will realize that ultrasonic bonding, thermocompression bonding, stitch bonding, or solder bonds can be used to connect the leads 15 and 17 to the contact pads 14 and 16. Layers 10 and 11 form between themselves a rectifying junction 18, layers 11 and 12 form between themselves a rectifying junction of opposite characteristics 19, and layers 12 and 13 form between themselves a rectifying junction 20 with directional properties similar to those of junction 18.

Figure 3:
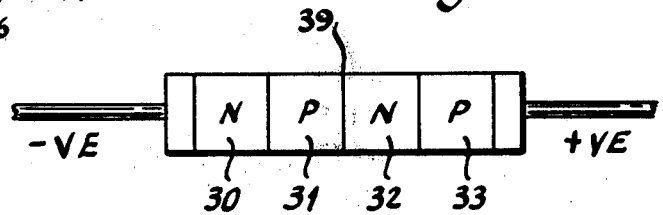
FIG. 3 is a view like FIG. 2, but depicting another form of semiconductor element constructed in accordance with the invention.

It will also be realized that the inverse STS shown in FIG. 3 with layers 30 and 32 of n-type germanium, and 31 and 33 p-type germanium can also be constructed, this being a simple inversion of the first device.

The operation of an STS will now be described with reference to FIGS. 4 and 5. As shown in FIG. 5a STS 60 is inserted in a circuit consisting of a voltage source $V_s$, mechanism 62 which has a resistance 63, and STS 60 linked in series by means of wiring 61. The STS 60 can be used to energize and de-energize a motor for a refrigerator compressor or the like.

Figure 4:
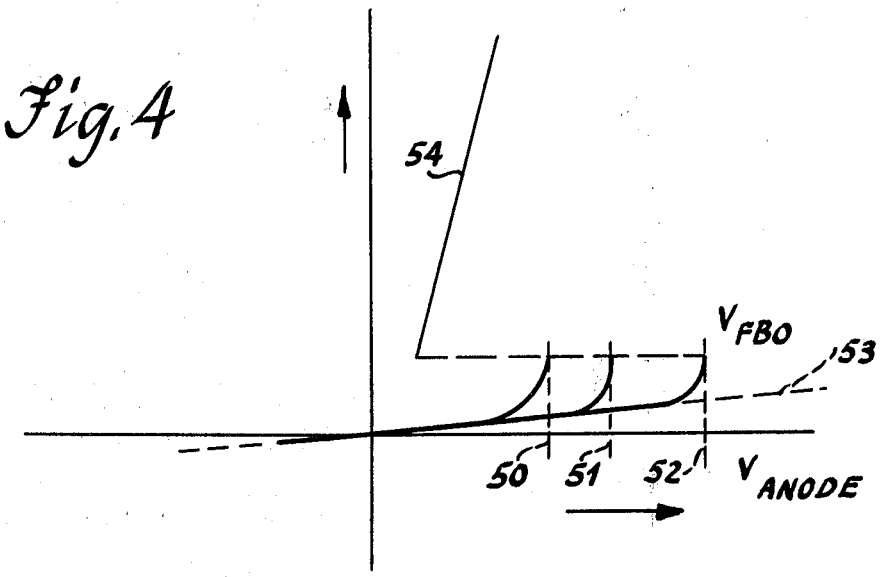
FIG. 4 is a graph depicting certain voltage-current relationships for the semiconductor elements depicted in FIGS. 2 and 3.
Figure 5A:
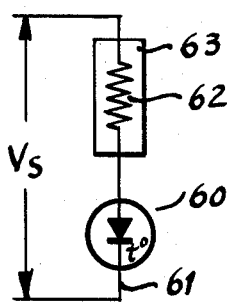
FIG. 5a is a diagrammatic showing of a D.C. energizing circuit utilizing a STS of the present invention.

The operation is initiated at the temperature at which the device 60 switches from a high resistance state which can be represented by line 53 on the voltage-current characteristics shown in FIG. 4 to a low resistance state represented by line 54 on the voltage-current characteristics shown in FIG. 4. The switching occurs when the forward breakdown voltage of STS 60 is exceeded by the voltage applied to device 60. The value of the forward breakdown voltage is determined by the temperature of the STS 60. This value varies with temperature as is shown in FIG. 4; points 50, 51 and 52 are given as examples achievable by varying the temperature of the STS 60. The temperature-responsive switching described above occurs when ohmic contact 16 is biased positive with respect to ohmic contact 14.

Figure 6:
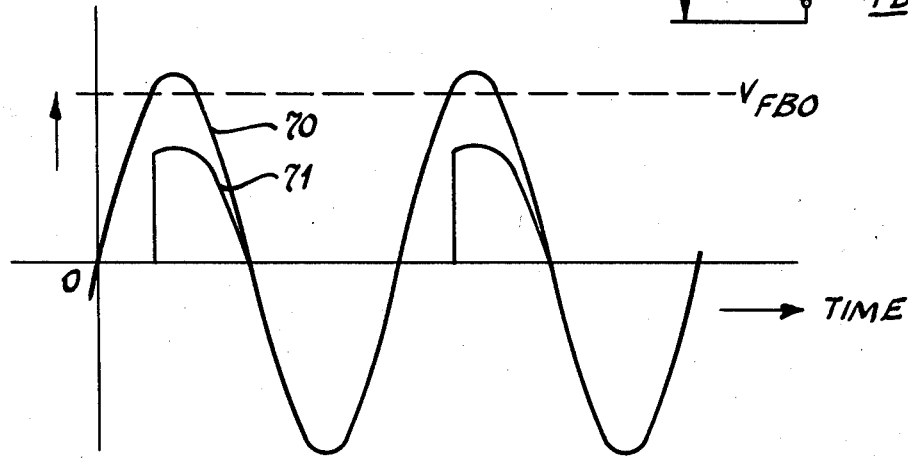
FIG. 6 is another graph depicting how the voltage and current relationship varies with respect to time in the operation of the STS of FIG. 2.

If an alternating voltage is applied the situation in FIG. 6 occurs. As the positive voltage applied to the p-layer with respect to the n-layer, for example to layer 10 with respect to layer 13 in FIG. 2, increases from zero, a small current, typically only a few microamperes flows in the circuit. Those skilled in the art will appreciate that the magnitude of this current is dependent upon the area of the device and may in certain larger area devices be several tens of milliamperes. If the applied voltage goes above the forward breakdown voltage determined by the structure of the device and the temperature of the device, it suddenly switches from the high resistance state to the low resistance state after which a large current flows which is limited only by the impedance 63 of the mechanism in the circuit.

Figure 5B:
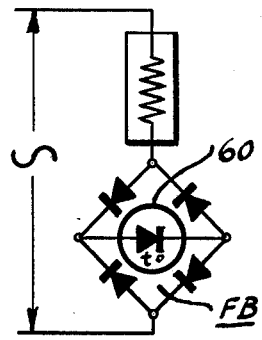
FIG. 5b is a view similar to FIG. 5a but with the STS utilized in an A.C. energizing circuit.

Curve 70 in FIG. 6 shows one way in which the applied voltage varies with time, and Curve 71 shows how the current which flows through the STS 60 varies with time. When the applied voltage goes into the negative half-cycle where, in FIG. 2, lead 17 is negative with respect to lead 15, a small current will flow. There are many ways in which this simple STS device can be incorporated into circuits so that voltages of suitable polarity and suitable magnitude are applied to the device to cause it to actuate in response to temperature changes; for example, use of a full wave rectifier bridge FB as shown in FIG. 5b to allow STS 60 to switch A.C. connected loads.

By choosing germanium, the correct resistivities of the four layers, and the correct geometries of the four layers, it is possible to create a range of devices which switch at predetermined temperatures in the range −55°C to +55°C and which can be used in circuits carrying supply voltages up to 400 volts. A specific device must be used for each particular combination of supply voltage and desired switching temperature.

Those skilled in the art know that the basic theory of the operation of four layer PNPN switching devices, with or without a gate, has been established for many years. However, the established theory has emphasized voltage or current induced switching and in some recent cases, radiation-induced switching as in light activated devices. Although temperature-induced switching has been recognized as possible, it has normally been considered as undesirable. As a matter of fact, temperature-induced switching, because of its heretofore unpredictable nature, has been deliberately minimized and deliberate measures have been taken to ensure that temperature-induced switching occurs at temperatures well above normal device operating temperatures.

In FIG. 4, it is shown that the breakover voltage is a function of temperature. For these devices, the switching voltage at 50 is defined as the voltage at which the device forward breakover voltage is equal to one-half of its value at some reference (very low) temperature and the switching temperature is defined as the temperature at which the device forward breakover voltage is equal to the switching voltage. Current four layer device technology is such that the switching temperature generally exceeds 65°C. The switching temperature as shown in this work, can be designed to be in the range −55°C to +55°C.

The theory of operation of the four layer semiconductor temperature switch STS begins with the theory of the basic four layer PNPN device, which is usually considered as two transistors, one PNP the other NPN, linked in such a way that two layers of each transistor are common.

The basic four layer PNPN device theory as illustrated by J. F. Gibbons, "Graphical Analysis of the I-V Characteristics of Generalized PNPN Devices", Proc. I.E.E.E., Vol. 55, Pg. 1366, 1967, indicates that the breakover voltage of the four layer device will occur at a given temperature at a value of device current at which the following function $g(I,T)$ has a minimum value:

$$g(I,T) = \alpha_n(I,T) + \alpha_p(I,T) + \frac{I_o(V,T)}{I} = \frac{1}{M(V,T)}$$

In the above equation, the $\alpha$'s are the transistor current gains of the NPN and PNP transistors, the $I_o$ is the reverse bias current of the center junction of the four layer device and $M$ is the avalanche multiplication factor for holes and electrons. As is indicated in the equation, the current gain of each transistor and the reverse bias current of the center junction, are generally functions of device current $I$ and device temperature $T$.

To those skilled in the art, it is known that the manner in which the transistor current gains vary with device current can be dictated by various mechanisms such as diffusion of minority carriers, drift of minority carriers in an electric field, the generation-recombination of minority carriers in a depletion region, conductivity modulation and several other mechanisms. In addition, however, the transistor current gains are fundamentally dependent upon temperature. Also, the reverse bias current $I_o$ depends upon voltage, device temperature, and the material the device is made from. It is within the spirit of this invention to utilize any of the mechanisms which control the manner in which the transistor current gain varies with current and temperature such that switching will occur at a predictable, predetermined temperature.

Hence, by a careful selection of device material, device layer conductivities, and device layer geometry, it is possible to design the device in such a way as to ensure that the temperature dependence of the above equation is very strong. Thus, it is possible to ensure that the breakover voltage (corresponding to the minimum in the above equation), is strongly temperature dependent.

Furthermore, by careful selection of device material, device layer conductivities, and device layer dimensions, it is possible to ensure that the switching voltage of a device occurs wherever desired in the range −55°C to +55°C. By specifically employing germanium, because of its relatively small band-gap energy and hence large reverse bias current, it is possible to provide a large change in the minimum of the function $g(I,T)$ with respect to temperature. Consequently temperature sensitivity of the forward breakover voltage is affected in a controllable fashion in the temperature range −55°C to +55°C. This temperature region is below that obtainable with larger band gap materials. Thus, it is possible to construct a semiconductor temperature responsive switch (STS) wherein the switching mechanism is strongly controlled by temperature in such a way that switching occurs consistently at a reproducible, predetermined temperature.

Referring once again to FIG. 2, each junction, 18, 19 and 20, has associated with it a depletion region extending into the layers on each side of the junction. Junction 18 in FIG. 2 has a depletion region 21 extending into layer 10 which contains fixed negative charges and a depletion region 22 in layer 11 containing fixed positive charges. Similarly, junction 19 has a depletion region 23 extending into layer 11 containing fixed positive charges and a depletion region 24 extending into layer 12 containing fixed negative charges. Junction 20 of FIG. 2 has a depletion region 25 containing fixed negative charges extending into layer 12 and a depletion region 26 containing fixed positive charges extending into layer 13.

It will be recognized that similar depletion regions exist in the STS device of FIG. 3 with the correct sign of fixed charges associated with the different conductivity of materials. Thus, wherever one talks of a depletion region in an n-type semiconductor, the discussion refers to a region with the mobile charges removed and fixed positive charge left, and wherever one talks of a depletion region in a p-type semiconductor one talks of mobile charges removed and a fixed negative charge left. In the n-type semiconductor the mobile charges are electrons and in the p-type semiconductor they are holes. The electrons in an n-type material and the holes in the p-type material are called majority carriers. Holes can exist in an n-type material and electrons can exist in a p-type material where they are called minority carriers.

If it is assumed that the STS of FIG. 2 is held at a temperature below its switching temperature and that a positive voltage, lower in magnitude than the forward break-over voltage at this temperature, is applied to lead 17 with respect to lead 15, then the widths of the depletion regions 21, 22, 23, 24, 25 and 26 are determined by the magnitude of the voltage applied and the conductivity of layers 10, 11, 12 and 13. In this situation junctions 18 and 20 are referred to as forward biased and junction 19 is referred to as reverse biased. Further, let us assume that the magnitude of the applied voltage is maintained constant as the temperature of the device increases. At all temperatures above absolute zero, a small current will flow between leads 17 and 15, the magnitude of the current being determined by the material, the resistivity of the layers 10, 11, 12 and 13, the temperature of the device and the properties of junction 19 in reverse bias. This current is due in part to thermally-generated charge-carriers of positive and negative signs which are created in the body of the device. As the temperature is increased more thermally-generated positive and negative charge-carriers are created.

The thermally-generated positive carriers in layer 11 are minority carriers in an n-type semiconductor and move under the influence of a diffusive force and the electric field due to the voltage applied to lead 17 with respect to lead 15 towards junction 19. When the minority charge-carriers reach the depletion region 23, they are swept under the influence of the local electric field existing in the depletion regions 23 and 24 towards layer 12 where they serve to increase the forward-bias voltage across junction 20 so increasing the injection of negative charge carriers from layer 13 into layer 12.

These negative charge-carriers are minority carriers in layer 12 and under the influence of a diffusive force and the electric field produced by the voltage applied to lead 17 with respect to lead 15, the minority carriers in layer 12 move toward junction 19; when they enter the depletion region 24 they are swept across the junction under the influence of the local electric field existing in the depletion regions 23 and 24 of junction 19. Then the negative charge-carriers enter layer 11 where they become part of the population of majority carriers in layer 11 and serve to increase the forward-bias voltage across junction 18 which in turn causes an increase in the current of positive charge-carriers from layer 10 to layer 11.

These positive charge-carriers become minority carriers in layer 11 and act in a similar manner as the thermally induced positive charge carriers in layer 11, i.e., they move towards junction 19 and are swept across it under the influence of the field in the depletion layers 23 and 24. In layer 12 they increase the forward bias voltage across junction 20 so increasing the return flow of negative charge carriers from layer 13 into layer 12.

Eventually the temperature-induced increases in positive and negative currents across junction 19 cause compensation of the fixed positive charges in the depletion layer 23 and the fixed negative charges in the depletion layer 24, so reducing the reverse-bias voltage across junction 19. At the predetermined switching temperature the charge compensation changes the reverse bias to forward bias across junction 19, so causing the STS to switch from a high impedance state to a low impedance state.

In accordance with this invention the principal parameters controlling the switching temperature are the selection of the thicknesses of layers 11 and 12, the selection of the resistivities of layers 11 and 12, the minority carrier lifetimes within layers 11 and 12, and the injection efficiency of minority carriers from layer 13 into layer 12 and the injection efficiency of minority carriers from layer 10 into layer 11. By careful selection of these parameters it is possible to fabricate STS's capable of operating at specific voltage conditions and switching at specific temperatures within the ranges mentioned above.

The upper voltage limits in germanium occur at about 400 volts and are associated with the onset of breakdown phenomena in the material, for example field-induced ionization. Also, the capability of the material to handle large currents at high voltages is limited by the self-induced temperature rise in the material eventually leading to permanent damage to the device. The lower operating temperature is fixed by the decrease in thermal generation of carriers.

In practical STS's a leakage current occurs which is determined by the thermal generation of carriers within the material, and the reverse-bias properties of the center junction, junction 19, in FIG. 2 or junction 39 in FIG. 3, for example, and also by the imperfection of the passivation of the STS surfaces and the existence of surface leakage currents.

In the STS of FIG. 2, layer 12 is chosen to be high resistivity material. The minority carrier lifetimes in the layer must be in the range 1 to 10 microseconds to provide satisfactory operation in the temperature range around room temperature. It is preferable to have one emitter injection efficiency close to unity and the other emitter injection efficiency much less than unity in order to produce proper switching. In the STS of FIG. 2 the junction 20 is chosen to have a high value of injection efficiency. It is desirable to select the injection efficiency to be greater than 80%. In order to maintain adequate feedback produced by the minority charges injected across the emitter junction, 20, the transfer efficiency for these carriers across layer 11 must be high so that the minority carriers reach the center reverse-biased junction 19.

The injection efficiency of minority carriers depends upon the presence of recombination-generation centers in the emitter junction, junction 20 in FIG. 2, the emitter region thickness and resistivity, layer 13, the device temperature, the minority carrier lifetime and the resistivity of layer 12. Also, the injection efficiency depends upon the potential difference applied across junction 20. Similar criteria apply to the determination of the injection efficiency for minority carriers across the second emitter junction in the device junction 18.

The transfer efficiency for minority charges across the drift field region in layer 12, FIG. 2, depends upon the width of this layer, the minority carrier lifetime in the layer, the level of the injection current, the number of recombination-generation generation centers in this region, the resistivity of this region, and the potential difference applied across this region. The collection efficiency for minority carriers approaching a junction, junction 18, junction 19, or junction 20, depends upon the potential difference across the junction, passivation of the junction, the collector junction injection efficiency, the width of the collector layer, that is either layer 10 or 13, the resistivity of these layers, and the potential difference across these layers.

A similar discussion can be presented for the STS of FIG. 3 with layer 32 as the high resistivity layer.

FABRICATION OF A SEMICONDUCTOR TEMPERATURE SWITCH

There are many ways in which these STS's can be fabricated; two ways will be described here as examples.

FIGS. 7 and 8 show schematically the process steps required to fabricate a PNPN STS. Discussing the semiconductor fabrication method, the terminology that is known to those skilled in the art of the transistor field will be used. The references to majority carriers mean those carriers in the material under discussion, i.e., holes in p-type materials, or electrons in n-type material. It is the charge carriers, which are either free holes or free electrons, which are responsible for the passage of current through a semiconductor material. The phrase minority carriers is intended to signify those carriers in the minority in a particular material, e.g., holes in n-type material or electrons in p-type material. References to carrier concentration usually mean the concentration of the impurity atoms added to the semiconductor material to endow it with the P- or n-type property. It is these impurities which impart the conductivity characteristics to intrinsic semiconductor materials.

In this description reference will be made to a semiconductor device based upon so-called $\pi$-type or high intrinsic impurity germanium which is utilized as a substrate. The significance of the designation $\pi$-type is that the material tends to have few free carriers within its bulk but those majority carriers which do exist freely in the bulk are holes. It will be readily apparent that a different substrate with high resistivity n-type characteristics could also be used as the basis for a device in which case all references to regions which are of one conductivity type in the $\pi$-type germanium will be of the opposite conductivity type if the device is basically made from $\nu$-type germanium. Furthermore, those operations which are described as diffusion operations could also be achieved by epitaxial growth, alloying, or ion implanatation techniques.

The starting material, as shown in FIG. 8a, is a wafer of $\pi$-type germanium 74 which is subjected to inspection to ensure that gross defects such as scratches, grain boundaries, and pits are not present. The resistivity of the germanium should be about 25 ohm centimeters and the carrier lifetime about 1000 microseconds. A wafer thickness of about 10 mils is adequate. Both surfaces of the wafer are polished to a mirror finish ending with a 0.5 micron diameter polishing grit. A doped silicon oxide film of about 2000–5000 angstroms thick is deposited on each wafer surface by any suitable technique. One technique which has been used is the spin-on process in which a layer composed of gallium, arsenic, and silicon oxide suspended in an alcohol solution is spun on. Such solutions mixed in a 10:1 gallium and arsenic ratio using those known in the trade as "Galliumsilicafilm" and "Arsenocilicafilm" have proved useful. The resulting silicon oxide layers are designated 80 and 81 in FIG. 8b.

The gallium serves as the p-type diffusion source and the arsenic serves as the n-type diffusion source. A standard diffusion is achieved by heating the wafer to 900°C for 16 hours in a reducing atmosphere. Because of the different diffusion coefficients for gallium and arsenic, the simultaneous double diffusion results in an n-type arsenic doped layer about 3 mils deep as measured from the surface of the germanium wafer, and a p-type gallium doped layer about 0.3 mils deep as measured from the surface of the germanium wafer. These layers are shown in FIG. 8c where 75 and 76 designate regions where the concentration of arsenic ions is sufficiently high to change the conductivity of the material from the weakly p-type material to n-type material. Regions 77 and 78 are layers where gallium has diffused into the wafer in such concentrations that the arsenic ions present are compensated and the resistivity is returned to the p-type due to the presence of gallium ions.

After the diffusion step an annealing step is required to insure that the minority carrier lifetime in the $\pi$-type germanium is adequate for the switching temperature required. Typically, the annealing step comprises reducing the annealing temperature from 900°C to 450°C in steps of 25°C and holding the wafer at each of the intermediate temperatures for a period of time. when this is completed the dimensions and carrier concentrations of the various regions, with reference to FIG. 8c, will be as follows:

Layers 77 and 78 are about 0.3 mils thick heavily doped p-type with a gallium surface concentration of about $5 \times 10^{18}$ cm$^{-3}$.

Layers 75 and 76 are about 3 mils thick, lightly doped n-type with an arsenic surface concentration of $10^{17}$ cm$^{-3}$.

Layer 79 is about 4 mils thick between layers 75 and 76 and is $\pi$-type germanium with a resistivity of 17 to 20 ohm centimeters.

For STS's with a switching temperature of 0°C, the minority carrier lifetime in the $\pi$-type germanium should be about 10 microseconds, while for STS's with a switching temperature about room temperature, the minority carrier lifetime in such material should be about 2 microseconds.

Next a mechanical lapping technique is employed to remove the doped oxide layers 83 and 84 in FIG. 8c, and the bottom p-type layer 78. This is preferably done with a 5 micron lapping compound. The resulting lapped wafer is depicted in FIG. 8d.

At this point the lapped wafer is cleaned employing standard semiconductor cleaning processes, using acetone and deionized water. After the wafer is cleaned, metalization is applied to both the top and bottom surfaces of the wafer. The metalization can be accomplished in a number of different ways. One way is to apply nickel in an electroless manner up to a thickness of 0.05 mils as depicted by layers 85 and 86 in FIG. 8e. This is followed by an electro plating of tin on top of the nickel thereby providing layers 87 and 88 of 0.05 mils thickness. The plated or metalized wafer is again cleaned in a de-ionized water rinse.

The top and bottom surfaces of the diffused and plated wafer are then prepared for chemical etching of discrete dies or devices, by waxing the wafer down onto a ceramic substrate as depicted by layer 89 in FIG. 8f using apiezon wax (layer 90). The apiezon wax protects the germanium from the acid etch to be employed and is also used as the top surface layers 91 and 92 on the substrate to delineate the dies to be acid etched. The acid employed is CP-4A.

The result of the etching process is shown in FIG. 8g, where discrete dies 93 and 94 have been acid delineated. These discrete dies are then removed from the substrate and cleaned, using ultrasonic baths and rinses of trichlorethylene, acetone, and de-ionized water. The result is shown in FIG. 8h. The area of the device depends upon the current levels and passivation requirements.

Then as shown in FIG. 8i, a complete device 95 is bonded to a metallic header 96 with a conductive feedthrough 97. One side of the device 95 is directly bonded by a suitable technique, for example, solder bonding to the metallic header surface 98, while the other side of the device 99 is connected by a wire 100 to the conductive pin 97. In this way, a semiconductor temperature switch (STS) can be constructed and lead 97 becomes the anode lead and lead or header base 96 becomes the cathode lead. This device can then be tested and encapsulated in a manner to produce the device schematically depicted in FIG. 2.

Figure 9:
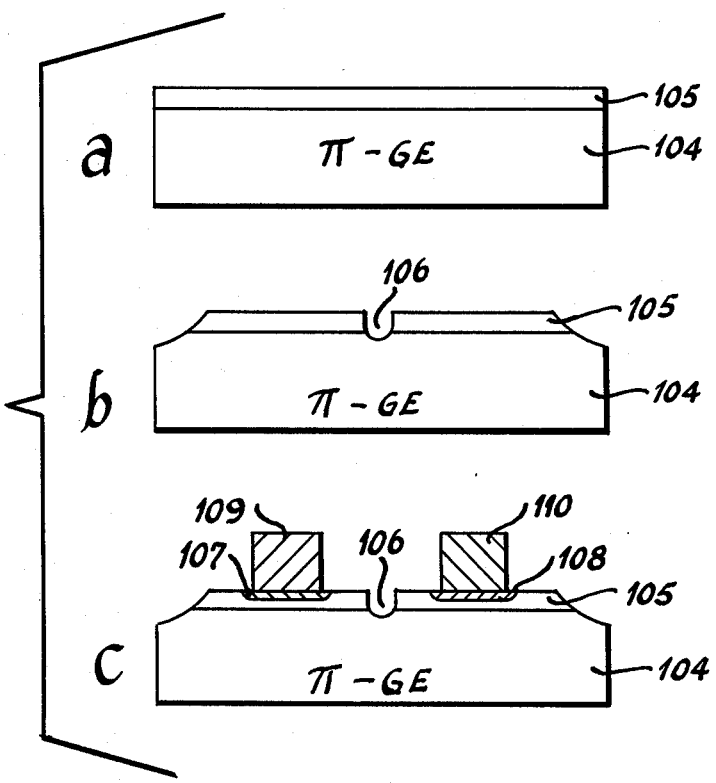
FIG. 9 is a view like FIG. 8 but showing the intermediate states in the fabrication of another preferred form of an STS.

Although this description is given to demonstrating a practical approach to fabricating STS's in germanium it is possible to fabricate these devices in any convenient manner as long as the geometry and carrier concentrations of the two inner layers can be controlled to better than 10% accuracy. Among process variations which have been tried is a process beginning with a diffusion of arsenic from a spin-on layer of Arsenosilicafilm placed on one surface of the $\pi$-type germanium wafer 104 as shown in FIG. 9. The wafer 104 is held at a temperature of 750°c for six days during which time the wafer changes on one surface to n-type germanium to a depth of 3 mils, 105 FIG. 9a. Then the wafer is cut into devices approximately 100 mils by 300 mils and a channel about 5 mils wide by 5 mils deep is cut into the center of each device, 106 FIG. 9b. By a conventional etching technique, mesas are prepared close to the cut on each side and a p-type region 107 prepared by alloying indium and a heavily doped n-type region 108 prepared by alloying a 3% antimony alloy are produced. This is achieved by heating suitable slugs 109 and 110 to 520°C for three minutes and then cooling slowly to provide the resulting assembly shown in FIG. 9c. After etching to clean up the surfaces, leads can be attached to the alloy slugs applied to the mesas.

As an example of the type of performance achievable, several devices have been made using the mixed diffusion-alloying technique which have switching temperatures ranging from −50°C to about +55°C. Depending upon variances in device preparation, the forward breakdown voltage at low temperature varied between devices and was as high as 270 volts. The reverse breakdown voltage was usually over 200 volts and in some devices reached 300 volts.

Similar devices can be made starting from high resistivity n-type ($\nu$ type) germanium. If the resistivity of the n-type germanium, for example, layer 32 in FIG. 3, is 30 ohm centimeters and the ratio between the width of this layer and the minority carrier diffusion length for holes in this layer is 3.46, then the switching temperature for the device is 17°C, while if the ratio between the thickness of this layer and the minority carrier diffusion length for holes is 3.32, the switching temperature for the device is 12°C.

FURTHER EMBODIMENTS OF THE DEVICE

Further embodiments of the STS are shown in FIGS. 10 to 29. There are many different STS formats and those shown above only represent a selection of possible configurations. Most notably planar devices can mesa devices can be fabricated but in addition, electrodes can be attached to points on the body of the device or the inner layers can be brought to the surface of the device or accessed by suitable geometries. Also, the outer p- and n-layers need not necessarily be one single continuous diffusion but they can be divided into several discrete pockets all maintained at the same potential by the application of the same voltage from a single common source to a multiplicity of electrodes attached to these pockets.

Therefore, in this specification wherever a layer is mentioned the reader should interpret this as meaning one of the four principle parts of the device with either p-type or n-type conductivity which may be a single volume of material whose linear dimension is greater than its thickness out it is not necessarily restricted to this and other geometries are possible including the division of the layer into several discrete volumes by the intervention of separating volumes which may contain a dielectric such as silicon oxide or dry air or they may contain material of the opposite semiconductivity type.

Similarly, the word region is to be interpreted as a volume of semiconductor forming an additional part of the device. Once again, there are numerous different geometries possible including single volumes and multiple volumes for the same function. Wherever the word electrode is used, it is to be interpreted as a suitable metal contact applied to the semiconductor material to carry either the current to be switched, or the bypass current in the shorted emitter case, or the control voltage in the other cases. No restrictions are placed on the shape or geometry of the electrodes which may be small areas, rectangles, squares, circles, annuli or other shapes, or formed of a multitude of parts. Wherever the word device is used this is to be interpreted as any of the conventional semiconductor device forms, such as a planar device, a mesa device, or integrated device, but not necessarily restricted to these since many other STS forms are possible.

In every STS the forward-voltage conditions are those for which the outer p-type layer is positive in potential with respect to the outer n-type layer, while the reverse-bias conditions are those in which the outer p-type layer is at a negative potential with respect to the outer n-type layer. It will also be obvious that in all of the STS's shown in FIGS. 10 to 25, wherever a p-type layer is defined an n-type layer can be substituted as long as wherever an n-type layer is defined a p-type layer is substituted. However, in this case the sign of any control voltage applied must also be changed.

Any of the standard circuit and electrode configurations which allow control of the total current through the junctions in the device can also be used to control the switching temperature for the device. This current will vary depending upon the potential differences across the junctions within the device and these potential differences can be controlled by adding additional electrodes to the device to apply additional voltages to one or more layers within the device. Mechanisms which provide a current path to bypass a junction can also be used to modify the current through the junction.

Another mechanism is to provide an external source of current to one of the base layers so that the fixed charges in the depletion layers are compensated at a lower temperature than would otherwise be the case if the thermally generated current alone has to provide the charges necessary to compensate the fixed charges in the depletion layers. It is of course with the spirit and scope of this invention to use any suitable combination of these mechanisms to control the switching temperature.

Figure 10:
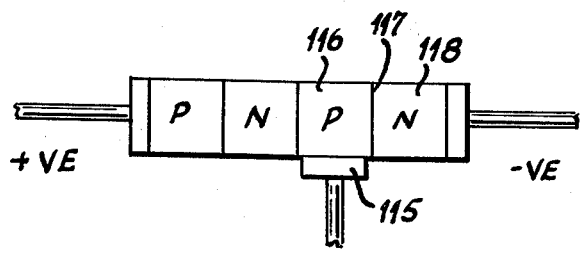
FIG. 10 depicts a modified form of the STS of FIG. 2 having a control electrode.

FIG. 10 shows a cathode gated STS in which an additional electrode 115 is connected to layer 116 and used to apply a voltage so that the potential difference which occurs across junction 117 is controlled. If layer 116 is held more negative with respect to layer 118, the current through junction 117 is reduced and the switching temperture for this device is increased. On the other hand, if layer 116 is made more positive with respect to layer 118, then this current through junction 117 increases and the switching temperature for the device is decreased.

Figure 11:
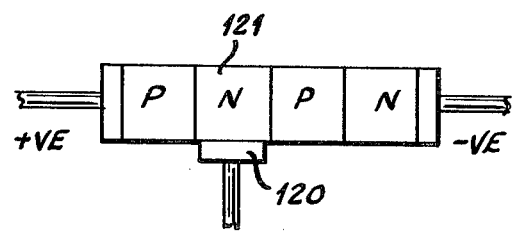
FIG. 11 depicts another modified form of the STS of FIG. 2 having a control electrode.

FIG. 11 shows an anode gated STS similar to that shown in FIG. 1, except that a third electrode 120 is applied by means of an ohmic contact to layer 121.

Figure 12:
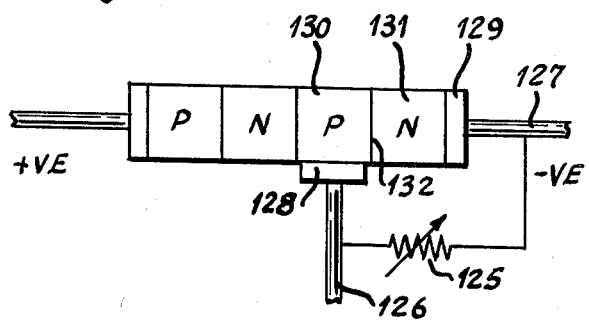
FIG. 12 is a view similar to FIG. 10 with an external control device added.

FIG. 12 shows another embodiment of this principle of the device shown in FIG. 10 wherein the variable resistor 125 is connected to leads 126 and 127, which in turn are connected to electrodes 128 and 129, respectively. Electrode 128 forms an ohmic contact with the p-type layer 130 and electrode 129 forms an ohmic contact with the n-type layer 131. Junction 132 is formed between layers 130 and 131.

Figure 13:
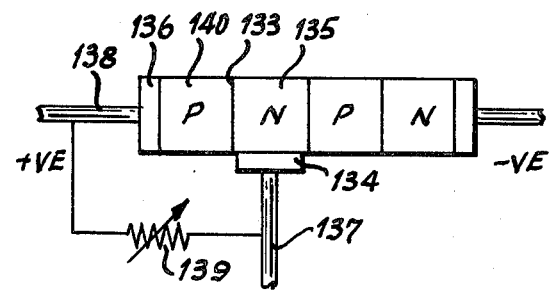
FIG. 13 is a view similar to FIG. 11 with an external control device added.

The distinction between the devices shown in FIGS. 12 and 13 lies mainly in the range of values for the injection efficiencies of the junctions involved. Junction 133 in FIG. 13 typically can be allowed to have an injection efficiency varying from 50% to close to 100%, while in FIG. 12 junction 132 typically has an injection efficiency of greater than 80%. As shown in FIG. 13 a third electrode 134 forms an ohmic contact to n-layer 135 of a four layer STS device. This electrode is linked to electrode 136 through leads 137 and 138, and the variable resistor 139. This forms a current path in parallel with the current path across the junction 133 between layers 140 and 135. If the variable resistor has infinite resistance then the switching temperature is at its lowest value and determined by the geometry and conductivities of the semiconducting layers in the device but if the variable resistor has zero resistance, then the switching temperature is at its highest value determined by the amount of current through junction 133. Devices made by the simple alloying-diffusion techniques demonstrated control over a temperature range up to 51°C. Specifically, one device which switched at 14°C when the variable resistor was at infinite resistance, switched at 65°C when its resistance was reduced to zero, while another device which switched at 48°C in the high resistance case switched at 85°C in the low resistance case.

Figure 14:
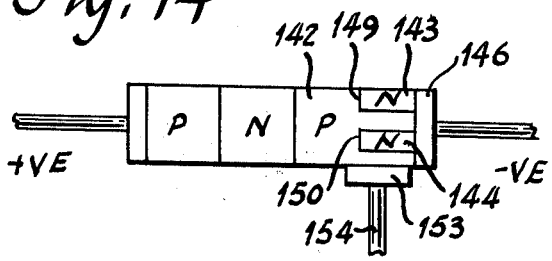
FIG. 14 depicts a third form of STS constructed in accordance with the invention.

In FIG. 14 a shorted emitter, cathode gated STS is shown, in which the n-type layer is divided into two parts, 143 and 144. The n-type layers and the p-layer 142 are all linked to the same electrode 146 by ohmic contacts, thus forming a permanent shorted emitter condition and, therefore, a permanent change in the switching temperature from that which would otherwise have been expected. Electrode 153 is attached by an ohmic contact to a p-layer 142 and a control voltage can be applied to lead 154 to change the potential difference across junctions 150 and 149.

Figure 15:
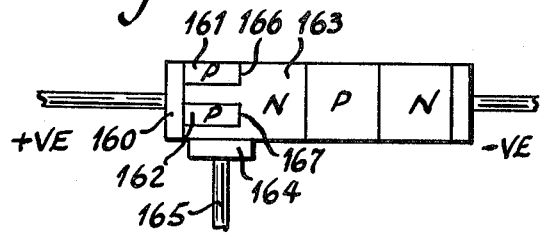
FIG. 15 depicts a modified form of the STS shown in FIG. 14.

FIG. 15 is a shorted emitter anode gated STS similar to the STS shown in FIG. 14 but with a shorted emitter formed of electrode 160, in ohmic contact with 161 and 162, and the n-type layer 163. Electrode 164 forms an ohmic contact with layer 163 and the control voltage can be applied by means of lead 165 to vary the magnitude of current through junctions 166 and 167, so controlling the switching temperature. As well as applying a control voltage through a third electrode in ohmic contact with one of the base regions of the device, it is possible to connect the third electrode to one of the base regions via an additional semiconducting junction. An example is the cathode junction gated STS shown in FIG. 16 consisting of a PNPN device with a shorted emitter where layers 170 and 171 are the p-layers and layers 172 and 173 are the n-layers. The current to be switched is carried through electrod 175 to electrode 176 which forms a shorted emitter structure with layers 171 and 173. The third electrode 177 which forms the gate electrode has an ohmic contact with an additional n-type region layer 178 which forms an extra junction 179 with the inner base layer 171.

FIG. 17 shows a similar STS to that of FIG. 16 with several simple circuit elements, switch 180, a battery 181, and variable resistor 182 linked in series between lead 183 attached to electrode 184 and lead 185 attached to electrode 186. This simple circuit allows the device to be changed between two switching temperatures, one when switch 180 is open and the other when such switch 180 is closed. In the latter case, by adjusting the value of resistor 182, it is also possible to adjust the switching temperature over a limited range as in the case of the devices shown in FIGS. 12 and 13. The STS shown in FIG. 17 can have one fixed defined switching temperature and a second limited range of switching temperatures depending upon the position of switch 180 and the value of resistor 182.

FIG. 18 shows an anode junction gated STS with a third electrode 193 connected by a contact to the inner n-type base region 190 through an additional p-type region 191 and an additional junction, 192. The major difference between this STS and the STS's shown in FIGS. 15, 16 and 17 is the absence of a permanent shorted emitter since electrode 193 in FIG. 18 makes an ohmic contact solely with the outer p-layer 191, whereas in FIG. 15 electrode 160 makes ohmic contact with both the outer p-layer 161 and the inner base layer 163. In FIG. 16 electrode 176 makes ohmic contact with the outer n-type region 173 and the inner p-type base region 171, while in FIG. 17 electrode 184 makes ohmic contact with the outer n-type region 187 and the inner p-type base layer 188. In these devices, the shorted emitter is utilized to increase the switching temperature to values above that which would be achievable from the geometry and the conductivity of the layers involved.

As shown in FIG. 19 the STS of FIG. 18 can be placed in a simple circuit with a switch 200, a battery 201, and a variable resistor 202 to be used in a similar way to the circuit and device of FIG. 17. That is, the STS of FIG. 19 can be changed between two predetermined switching temperatures depending upon the position of the switch 200, one being fixed and the other depending on the value of the resistor 202.

FIGS. 20 and 21 show two remote junction gate STS's in which the third control electrodes, electrode 210 in FIG. 20, and electrode 220 in FIG. 21, respectively, form contacts with the outer layers, the p-type layer 211 in FIG. 20, and the n-type layer 221 in FIG. 21, through additional diffused regions, in n-type region 212 in FIG. 20 and p-type region 222 in FIG. 21.

FIGS. 22 and 24 show two other STS configurations and FIGS. 23 and 25 show these STS's in simple circuits to allow the user to select between two predetermined switching temperatures by operating the switches 230 and 240 in the circuits 231 and 241. Furthermore, in the cases when the switch is closed, by adjusting the value of the resistance in the circuit, 232 or 242, the user can select a switching temperature within a predetermined range.

The STS of FIG. 22 is anlogous to the STS shown in FIG. 16 except that the additional electrode 250 forms an ohmic contact with an additional p-type region 251 in the n-layer 252. The STS also has analogies with the device in FIG. 18 except that the electrode 253 forms ohmic contacts with both the outer p-layer 254 and the inner n-type base layer 252; that is it forms a shorted emitter. Similarly, the STS of FIG. 24 has anlogies with the STS's shown in FIGS. 18 and 16.

The STS in FIG. 24 differs from that in FIG. 18 by having the third electrode 263 form an ohmic contact with an additional n-type region 265 diffused into the inner p-type base layer 266. The STS in FIG. 24 differs from that in FIG. 16 by having electrode 267 which forms an ohmic contact to the outer n-layer 268 but does not have an ohmic contact with the p-type base layer 266; that is it does not form a shorted emitter.

Just as other examples of the simple STS structure can be derived, so can simple bidirectional structures be designed capable of operating in alternating current circuits. In this case, when the device is heated up past the switching temperature it will allow current to pass no matter in which direction the polarity of the voltage applied to the electrodes. The simplest structure is that shown in FIG. 26 where two simple STS's 275 and 276 are shown linked to two leads 277 and 278 by two parallel circuits. If necessary these two STS's can be packaged in the same envelope 279. The STS's 275 and 276 must be matched in their switching temperatures in order to provide proper bilateral response.

BILATERAL SEMICONDUCTOR TEMPERATURE SWITCH

A detailed structure of a typical bilateral STS constructed in accordance with this invention is shown in FIG. 27. It consists basically of a p-type layer, 450 formed of high resistivity germanium. Typically this germanium may have a resistivity ranging from about 17 to 20 ohm centimeters and a thickness of about 3 mils. On either side of this p-type layer are n-layers 453 and 455 which represent the second base regions of the STS's, and n-layers 451 and 454 which represent the cathode layers of the STS's. The outer p-layers are 452 and 456. So the device in essence consists of two basic STS's in anti-parallel to each other driven by reverse polarity voltages, the first STS being composed of layers 452, 453, 450, and 454 while the second STS is composed of layers 456, 455, 450, and 451. Suitable ohmic contacts are applied to each outer layer 457, 458, 459 and 460. Individual leads are attached to each ohmic contact 461, 462, 463 and 464 and these leads are connected in pairs, 461 and 462 which are connected to lead 468 and 463 and 464 which are connected to lead 467. The current to be switched is carried by leads 467 and 468.

Several different structures are possible for the STS shown in FIG. 27. For example, the regions 475 and 476 may be occupied by some dielectric material such as dry air or silicon oxide or they may be occupied by high resistivity p-type germanium of the same type as that in the layer 450. The STS of this bilateral type has similar switching characteristics in terms of forward breakdown voltage and its switching temperature as the simple unilateral STS devices described above.

Just as the unilateral STS devices can have the semiconductor layers with opposite polarity types, so can the bilateral STS devices hve opposite polarity types. FIG. 28 is such an STS where 480 is an n-type region, about 3 mils thick, and resistivity 20 ohm centimeter. In this STS the outer layers 481, 483, 484, and 486 are of opposite polarity of semiconductor type to those in FIG. 27 and so are the second base layers 482 and 485.

By the selection of appropriate semiconductor materials and device geometry a shorted emitter version of a bilateral STS, as shown in FIG. 29, can be fabricated to switch at low temperatures. The STS of FIG. 29 includes a p-type layer 490, contiguous n-type layers 491 and 492 disposed on opposite sides of the layer 490, and additional p-type layers 493 and 494 which are contiguous to portions of the layers 491 and 492 respectively. Suitable ohmic contacts 495, 496,497 and 498 are applied to each of the layers 493, 491, 492 and 494, respectively. Individual leads are connected to each of the ohmic contacts and those connected to contacts 495 and 496 are connected together to a common lead 499, and those connected to contacts 497 and 498 are connected to a common lead 500. The circuit in which current is to be switched is carried by the leads 499 and 500.

Again, it will be recognized that by the addition of electrodes and circuit elements it is possible to control the switching temperature at which the bilateral STS devices will switch either from one fixed temperature to another fixed temperature or over a limited temperature range if an adjustable circuit element is provided. FIG. 30 shows the STS of FIG. 28 with a variable resistor 534 attached to leads 528 and 526 which in turn are attached to electrodes 527, and 525, respectively. Similarly, the variable resistance 536 is attached to the leads 522 and 524 which in turn are attached to the electrodes 521 and 523 respectively. By means of a suitable mechanism 537, the variable resistors 534 and 536 are ganged so that their resistances are equal and are changed in unison so that they remain equal no matter what the setting of the mechanism 537. In this way, the switching temperatures of both halves of the bilateral STS structures, can be changed by equal increments and therefore the operation of the device in a circuit is fully symmetrical.

A description of a bilateral STS device construction technique follows with reference to FIGS. 31 and 32.

The starting material is a wafer 600 of π-type germanium which is subjected to inspection to ensure that gross defects such as scratches, grain boundaries, and pits are not present. The resistivity of the germanium should be at least 25 ohm centimeters and the carrier lifetime about 1000 microseconds. A wafer thickness of about 10 mils is employed. Both surfaces of the wafer are polished to a mirror finish using 0.5 micron diameter polishing grit. A silicon oxide film of about 2000 to 5000 angstrom unit thickness is deposited on each wafer surface by the spin-on process. These silicon oxide layers are items 620 and 622 in FIG. 32b. By utilizing standard photoresist processes, 625, 626 in FIG. 32c, 627, 628 in FIG. 32d, and etching techniques, holes in the oxide layers, such as 630, 631, 632 and 633 are etched using a buffered HF solution, FIG. 32e. These holes reveal the surface of the π-type germanium. Then n- and p-type diffusions are made into the substrate of the π-type germanium, with the n-type diffusant diffusing selectively through the holes in the silicon oxide mask. One way to achieve this doping is to spin on suitable sources of gallium, for the p-type diffusion, and arsenic for the n-type diffusions, 635 and 637 in FIG. 32f. By using a mixture of gallium and arsenic doped silicon oxide it is possible to diffuse both n-type and p-type diffusants simultaneously. The temperature is then raised to 900°C for 16 hours and the gallium and arsenic diffuse into the π-type germanium substrate as shown in FIG. 32f.

The silicon oxide mask, 640, 641, 642, 643, 644 and 645 in FIG. 32f, is capable of blocking arsenic but not gallium during the diffusion process. A p-type layer, 646, and 647 in FIG. 32f, will form across both top and bottom surface during the diffusion. In the regions defined by holes in the silicon oxide film, 630, 631, 632 and 633 in FIG. 322e, n-type regions, 648, 649, 650 and 651 in FIG. 32f, will be formed. The p-type dopant, gallium, is of such a concentration and diffusion rate that a p-type region will be formed directly under the holes in the silicon oxide film, 646 and 647, in FIG. 32f while at a greater depth under these holes, the n-type regions, 648, 649, 650 and 751 are formed. After the diffusion steps an annealing step is required to ensure that the minority carrier lifetime in the π-type germanium is correct for the switching temperature required, about 10 microseconds for 0°C. Typically, the annealing steps comprise reducing the temperature from 900°C to 450°C in steps of 25°C and holding the wafer at the intermediate steps for periods of time. The processing is continued by the removal of the oxide and the application of photo resist, 652 and 654 in FIG. 32g followed by exposures, develop and post bake resulting in the mesa delineation mask 656 and 658 in FIG. 32h. Mesas are formed by etching to a depth deeper than the 0.3 mil surface p-type material, 647 and 646 in FIG. 32f, but not as deep as the 3 mils deep n-type material regions, 648, 649, 650 and 651 in FIG. 32f. The photo resist is then removed, FIG. 32i.

A silicon oxide passivation layer, 660 and 662 in FIG. 32j, is applied to both sides of the wafer by the spin on technique. A bake in air at about 500°C for about a half hour can be used to improve the silicon oxide passivation properties. Photo resist is again applied to the wafer, FIG. 32k, followed by exposure, develop and postbake, FIG. 32L. The holes in the photo resist pattern, 670, 671, 672 and 673, in FIG. 32L, define the areas for metal contacts. The photo resist processed wafer, FIG. 32L, is etched in a buffered HF etchant to etch oxide windows, and then the photo resist is removed, FIG. 31m. Using an electroless nickel plate the non-oxide covered areas of the wafer are plated followed by a lead-tin solder dip resulting in metal contacts 680, 681, 682 and 683 in FIG. 32n.

The wafer is then separated into individual devices, tested, followed by solder attachment to a metal header, 690 in FIG. 32p. A top surface metal contact 692 metal post 694 and insulator 696 are used in the device mounting. Solder, 697, 698 and 699 is used for all electric contacts.

While the forgoing fabrication method has been described in conjunction with FIG. 32 showing a single device it is obvious that the method can be readily used in making multiple devices on a common substrate.

FIGS. 33 and 34 indicate several possible basic applications of the unilateral and bilateral STS's. In FIG. 33 a gate-controlled unilateral STS 754 is shown, connected in series with a motor 751, with internal resistance 752, and is linked to a DC source by wiring 750. The gate-control circuit consists of a voltage source linked to a variable resistance 756 by means of a circuit 758 containing a switch 755. As the temperature increases from below the switching temperature there is a small current flowing through the circuit 750 and above the switching temperature a large current flows and causes the motor to operate, thus controlling the temperature of the environment 753. If the switch 755 is opened the switching temperature is at some well-defined lower value, while if the switch 755 is closed the switching temperature is at some well-defined higher temperature determined by the setting of the variable resistor 756. The positive voltage is applied to the outer p-type layer and the negative voltage is applied to the outer n-type layer. The gate electrode is held positive with respect to the outer n-layer.

FIG. 34 shows a similar circuit consisting of an alternating voltage source linked by circuit 760 to a bilateral STS 764 and a motor 762 with internal resistance 761. The bilateral STS 764 switches as the temperature of the region 763 increases and when it switches the motor 762 is started to perform any action required by the change of temperature.

In FIG. 35 a bilateral STS 783 shown with gate controls on both sides of the switch is linked in series with a motor 781 with internal resistance 782 by wiring 780 to an alternating voltage source. Each gate-control circuit consists of a switch 787 in one circuit and 788 in the other circuit and the variable resistance 786 in one and 785 in the second circuit. The switches are ganged together by a mechanism 789 so that they are both closed or opened simultaneously and the variable resistors are ganged together by a mechanism 790 so that the setting of each changes equally. In this way the temperature at which the bilateral STS will operate can be changed from a fixed predetermined point where the switches 787 and 788 are opened to a second fixed predetermined point where the switches 787 and 788 are closed and where in the latter case the temperature is determined by the settings the resistors 785 and 786. By providing a continuous range of operation of the resistors 785 and 786 it is possible to adjust the switching temperature over a range of temperatures. Once again, the applications of such STS's in systems will be obvious to those skilled in the art.

We claim:

1. A semiconductor temperature switch actuatable at a predetermined temperature within a temperature range up to about 55°C and adapted for operating at voltages up to about 400 volts, comprising a semiconductor device formed of first, second, third and fourth layers defining therebetween first, second and third junctions:

said first layer being of one conductivity type of germanium and having a first current-carrying electrode attached thereto;

said second layer being a thin stratum of opposite conductivity type of germanium with a transfer efficiency of minority charge carriers thereacross of at least about 50%;

said third layer being of said one conductivity type of germanium and having a resistivity greater than 0.01 ohm-centimeter and a minority carrier diffusion length, $L_d$, between about 0.5 mils and about 5 mils, and a thickness equal to between about 0.1 $L_d$ and about 10$L_d$;

said fourth layer being of said opposite conductivity type and having a second current-carrying electrode attached thereto;

said first junction having an injection efficiency of charge carriers into said second layer between about 50% and about 90%;

said second junction having a breakover voltage essentially equal to said operating voltage at said predetermined switching temperature within said temperature range when a voltage is applied to said electrode on said first layer with respect to said electrode on said fourth layer of such polarity as to reverse bias said second junction, and a low impedance subsequent to said switching at said predetermined temperature when said second junction becomes forward biased; and said third junction having an injection efficiency of charge carriers into said third layer of at least about 80%; whereby when said switch reaches said predetermined temperature, said second junction changes from a reversed biased to a forward biased junction to permit a marked increase in the flow of current therethrough.

2. A semiconductor temperature switch in accordance with claim 1 wherein said first layer is p-type germanium said second and fourth layers are n-type germanium, and said third layer is high purity, p-type germanium having a resistivity of at least 20 ohm-centimeters.

3. A semiconductor temperature switch in accordance with claim 2 wherein said first p-type germanium layer is gallium-doped and said n-type germanium is arsenic-doped.

4. A semiconductor temperature switch in accordance with claim 1 wherein said first layer is p-type germanium, said second and fourth layers are n-type germanium, and said third layer is $\pi$-type germanium.

5. A semiconductor temperature switch in accordance with claim 4 wherein said first p-type germanium layer is gallium-doped and said n-type germanium is arsenic-doped.

6. A semiconductor temperature switch in accordance with claim 1 wherein said first layer is n-type germanium, said second and fourth layers are p-type germanium and said third layer is n-type germanium with a resistivity of at least 20 ohm-centimeters.

7. A semiconductor temperature switch in accordance with claim 6 wherein said first n-type germanium layer is arsenic-doped and said p-type germanium is gallium-doped.

8. A semiconductor temperature switch in accordance with claim 1 wherein said first layer is n-type germanium, said second and fourth layers are p-type germanium and said third layer is $\nu$-type germanium.

9. A semiconductor temperature switch in accordance with claim 8 wherein said first n-type germanium layer is arsenic-doped and said p-type germanium is gallium-doped.

10. A semiconductor temperature switch in accordance with claim 1 including circuit means for varying said predetermined temperature within said range.

11. A semiconductor temperature switch in accordance with claim 1 including circuit means, incorporating variable resistance means, providing an electrical connection between said first layer through said first electrode and said second layer through a third current-carrying electrode attached to said second layer, whereby said predetermined switching temperature may be varied within a preselected range by varying the resistance in said circuit means.

12. A semiconductor temperature switch in accordance with claim 1 including circuit means, incorporating variable resistance means, providing an electrical connection between said fourth layer through said second electrode and said third layer through a third current-carrying electrode attached to said third layer, whereby said predetermined switching temperature may be varied within a preselected range by varying the resistance in said circuit means.

13. A semiconductor temperature switch in accordance with claim 1 including a third current-carrying electrode attached to said third layer for controlling said switching temperature within a preselected range.

14. A semiconductor temperature switch in accordance with claim 13 wherein said second electrode is also attached to said third layer.

15. A semiconductor temperature switch in accordance with claim 1 including a third current-carrying electrode attached to said second layer for controlling said switching temperature within a preselected range.

16. A semiconductor temperature switch in accordance with claim 15 wherein said first electrode is also attached to said second layer.

17. A semiconductor temperature switch in accordance with claim 1 wherein said second electrode is also attached to said third layer and including a fifth layer of the same conductivity type as said fourth layer and defining a fourth junction with said third layer, and a third current-carrying electrode attached to said fifth layer, whereby said predetermined switching temperature may be adjusted.

18. A semiconductor temperature switch in accordance with claim 17 having circuit means, including switch means, voltage source means and variable resistor means, connecting said second and third electrodes whereby said adjusted predetermined switching temperature may be varied within a preselected range by varying the resistance in said circuit means.

19. A semiconductor temperature switch in accordance with claim 1 wherein said first electrode is also attached to said second layer and including a fifth layer of the same conductivity type as said first layer and defining a fourth junction with said second layer, and a third current-carrying electrode attached to said fifth layer, whereby said predetermined switching temperature may be adjusted.

20. A semiconductor temperature switch in accordance with claim 19 having circuit means, including switch means, voltage source means and variable resistor means connecting said first and third electrodes, whereby said adjusted predetermined switching temperature may be varied within a preselected range by varying the resistance in said circuit means.

21. A semiconductor temperature switch in accordance with claim 1 including a fifth layer of the same conductivity type as said first layer and defining a fourth junction with said second layer and a third current-carrying electrode attached to said fifth layer whereby said predetermined switching temperature may be adjusted.

22. A semiconductor temperature switch in accordance with claim 21 having circuit means, including switch means, voltage source means, and variable resistor means, connecting said first and third electrodes whereby said adjusted predetermined switching temperature may be varied within a preselected range by varying the resistance in said circuit means.

23. A semiconductor temperature switch in accordance with claim 1 including a fifth layer of the same conductivity type as said fourth layer and defining a fourth junction with said third layer and third current-carrying electrode attached to said fifth layer whereby said predetermined switching temperature may be adjusted.

24. A semiconductor temperature switch in accordance with claim 23 having circuit means, including switch means, voltage source means and variable resistor means, connecting said second and third electrodes whereby said adjusted predetermined switching temperature may be varied with a predetermined range by varying the resistance in said circuit means.

25. A semiconductor temperature switch in accordance with claim 1 including a fifth layer of the opposite conductivity type as said first layer and defining with said first layer a fourth junction, and third current-carrying electrode attached to said fifth layer whereby said predetermined switching temperature may be adjusted.

26. A semiconductor temperature switch in accordance with claim 1 including a fifth layer of the opposite conductivity type as said fourth layer and defining with said fourth layer a fourth junction, and a third current-carrying electrode attached to said fifth layer whereby said predetermined switching temperature may be adjusted.

27. A bilateral semiconductor temperature switch comprising first and second switches constructed in accordance with claim 1, said first and second switches being connected in anti-parallel by circuit means such that the direction of said first switch is opposite to that of said second switch, whereby when one of said switches is in a forward conductivity state the other of said switches is in a reverse conducting state.

28. A bilateral semiconductor temperature switch actuatable at a predetermined temperature up to about 55°C and adapted for operating with voltages of alternating polarity up to about 400 volts, comprising two semiconductor assemblies, each of which is formed of first, second, third and fourth layers defining therebetween first, second and third junctions; said assemblies being arranged to form an integrated device wherein said third layer is common to both of said assemblies and said second layer of one of said assemblies and said fourth layer of said other of said assemblies are contiguous to one side of said common third layer and said fourth layer of said one of said assemblies and said second layer of said other of said assemblies are contiguous to the other side of said third common layer;
  said first layer of each of said assemblies being of one conductivity type of germanium and having a first current-carrying electrode attached thereto;
  said second layer of each of said assemblies being a thin stratum of opposite conductivity type of germanium with a transfer efficiency of minority charge carriers thereacross of at least about 50%;
  said third common layer of said assemblies being of said one conductivity type of germanium and having a resistivity greater than 0.01 ohm-centimeter and a minority carrier diffusion length, $L_d$, between about 0.5 mils and about 5 mils, and a thickness equal to between about 0.1 $L_d$ and about 10 $L_d$;
  said fourth layer of each of said assemblies being of said opposite conductivity type germanium and having a second current-carrying electrode attached thereto;
  said first junction of each of said assemblies having an injection efficiency of charge carriers into said second layer between about 50% and about 90%;
  said second junction of each of said assemblies having a breakover voltage essentially equal to said operating voltage at said predetermined switching temperature within said temperature range when a voltage is applied to said electrode on said first layer with respect to said electrode on said fourth layer of such polarity as to reverse bias said second junction, and a low impedance subsequent to said switching at said predetermined temperature when said second junction becomes forward biased; and
  said third junction of each of said assemblies having an injection efficiency of charge carriers into said common third layer of at least 80%;
  said first electrode of said one assembly and said second electrode of said other assembly being connected to a first common lead and said second electrode of said one assembly and said first electrode of said other assembly being connected to a second common lead; whereby when said switch reaches said predetermined temperature, said second junctions alternately change from reversed biased to forward biased junctions to permit a marked increase in the flow of current therethrough.

29. A bilateral semiconductor temperature switch in accordance with claim 28 wherein said first layers are p-type germanium, said second and fourth layers are n-type germanium, and said third common layer is high purity p-type germanium having a resistivity of at least 20 ohm-centimeters.

30. A bilateral semiconductor temperature switch in accordance with claim 29 wherein said first p-type germanium layer is gallium-doped and said n-type germanium is arsenic-doped.

31. A bilateral semiconductor temperature switch in accordance with claim 28 wherein said first layers are p-type germanium, and said third common layer is $\pi$-type germanium.

32. A bilateral semiconductor temperature switch in accordance with claim 31 wherein said first p-type germanium layer is gallium-doped and said n-type germanium is arsenic-doped.

33. A bilateral semiconductor temperature switch in accordance with claim 28 wherein said first layers are n-type germanium, said second and fourth layers are p-type germanium and said third common layer is n-type germanium with a resistivity of at least 20 ohm-centimeters.

34. A bilateral semiconductor temperature switch in accordance with claim 33 wherein said first n-type germanium layer is arsenic-doped and said p-type germanium is gallium-doped.

35. A bilateral semiconductor temperature switch in accordance with claim 28 wherein said first layers are n-type germanium, said second and fourth layers are p-type germanium and said third common layer is $\nu$-type germanium.

36. A bilateral semiconductor temperature switch in accordance with claim 35 wherein said first n-type germanium layer is arsenic-doped and said p-type germanium is gallium-doped.

37. A bilateral semiconductor temperature switch in accordance with claim 28 including circuit means for varying said predetermined switching temperature within said range.

38. A bilateral semiconductor temperature switch in accordance with claim 28 wherein said second layer of said one of said assemblies and said fourth layer of said other of said assemblies are contiguous; and said fourth layer of said one of said assemblies are said second layer of said other of said assemblies are contiguous.

39. A bilateral semiconductor temperature switch in accordance with claim 28 wherein said second layer of said one of said assemblies and said fourth layer of said other of said assemblies define a first spacing therebetween; and said fourth layer of said one of said assemblies and said second layer of said other of said assemblies define a second spacing therebetween.

40. A bilateral semiconductor temperature switch in accordance with claim 39 wherein said third layer extends into at least a portion of said first and second spacings.

41. A bilateral semiconductor temperature switch in accordance with claim 28 including first circuit means, incorporating first variable resistor means, providing an electrical connection between said first and second layers of said one of said assemblies through said first electrode and a third current carrying electrode attached to said second layer of said one of said assemblies; second circuit means, incorporating second variable resistor means, providing an electrical connection between said first and second layers of said other of said assemblies through said first electrode and a fourth current carrying elctrode attached to said second layer of said other of said assemblies; and means linking said first and second variable resistors such that the resistances in said first and second circuits may be varied simultaneously, whereby said predetermined switching temperature of said bilateral switch may be varied within a preselected range by varying the resistances in said first and second circuit means.

42. A temperature-controlled electrical circuit operable at temperatures up to about 55°C, comprising in combination
  a. d.c. voltage source means;
  b. d.c. motor means;
  c. semiconductor temperature switch means responsive to the temperature of an associated environment and arranged to actuate said motor means at a predetermined switching temperature within said range, said switch means comprising a semiconductor device formed of first, second, third and fourth layers defining therebetween first, second and third junctions;

said first layer being of one conductivity type of germanium and having a first current-carrying electrode attached thereto for connection to one side of said voltage source means;

said second layer being a thin stratum of opposite conductivity type of germanium with a transfer efficiency of minority charge carriers thereacross of at least 50%;

said third layer being of said one conductivity type of germanium and having a resistivity greater than 0.01 ohm-centimeter and a minority carrier diffusion length, $L_d$, between about 0.5 mils and about 5 mils, and a thickness equal to between about 0.1 $L_d$ and about 10$L_d$;

said fourth layer being of said opposite conductivity type and having a second current-carrying electrode attached thereto for connection to the other side of said voltage source means through said motor means;

said first junction having an injection efficiency of charge carriers into said second layer between about 50% and about 90%;

said second junction having a breakover voltage essentially equal to the voltage across said switch at said predetermined switching temperature when said voltage is applied to said electrode on said first layer with respect to said electrode on said fourth layer of such polarity as to reverse bias said second junction, and a low impedance subsequent to said switching at said predetermined temperature when said second junction becomes forward biased; and said third junction having an injection efficiency of charge carriers into said third layer of at least about 80%; whereby when said switch means reaches said predetermined temperature said motor means is actuated.

43. An electrical circuit in accordance with claim 42 including circuit means associated with said semiconductor temperature switch means for varying said predetermined switching temperature within a preselected range.

44. A temperature-controlled electrical circuit operable at temperatures up to about 55°C, comprising in combination
  a. a.c. voltage source means;
  b. a.c. motor means
  c. bilateral semiconductor temperature switch means responsive to the temperature of an associated environment and arranged to actuate said motor means at a predetermined switching temperature within said range, said switch means comprising two semiconductor assemblies, each of which is formed of first, second, third and fourth layers defining therebetween first, second and third junctions; said assemblies being arranged to form an integrated device wherein said third layer is common to both of said assemblies and said second layer of one of said assemblies and said fourth layer of said other of said assemblies are contiguous to one side of said common third layer and said fourth layer of said one of said assemblies and said second layer of said other of said assemblies are contiguous to the other side of said third common layer;

said first layer of each of said assemblies being of one conductivity type of germanium and having a first current-carrying electrode attached thereto;

said second layer of each of said assemblies being a thin stratum of opposite conductivity type of germanium with a transfer efficiency of minority charge carriers thereacross of at least about 50%;

said third common layer of said assemblies being of said one conductivity type of germanium and having a resistivity greater than 0.01 ohm-centimeter and a minority carrier diffusion length, $L_d$, between about 0.5 mils and about 5 mils, and a thickness equal to between about 0.1 $L_d$ and about 10 $L_d$;

said fourth layer of each of said assemblies being of said opposite conductivity type germanium and having a second current-carrying electrode attached thereto;

said first junction of each of said assemblies having an injection efficiency of charge carriers into said second layer between about 50% and about 90%;

said second junction of each of said assemblies having a breakover voltage essentially equal to the voltage across said switch means at said predetermined switching temperature when a voltage is applied to said electrode on said first layer with respect to said electrode on said fourth layer of such polarity as to reverse bias said second junction, and a low impedance subsequent to said switching at said predetermined temperature when said second junction becomes forward biased; and said third junction of each of said assemblies having an injection efficiency of charge carriers into said common third layer of at least 80%;

said first electrode of said one assembly and said second electrode of said other assembly being connected to a first common lead connected to one side of said voltage source means and said second electrode of said one assembly and said first electrode of said other assembly being connected to a second common lead connected to the other side of said voltage source means through said motor means; whereby when said switch reaches said predetermined temperature, said motor means is actuated.

45. An electrical circuit in accordance with claim 44 including circuit means associated with said semiconductor temperature switch means for varying said predetermined switching temperature within a preselected range.

* * * * *

UNITED STATES PATENT AND TRADEMARK OFFICE
CERTIFICATE OF CORRECTION

PATENT NO. : 3,971,056

DATED : July 20, 1976

INVENTOR(S) : Stanley V. Jaskolski, Robert W. Lade, Herman P. Schutten, Gordon B. Spellman and Lawrence E. Van Horn It is certified that error appears in the above-identified patent and that said Letters Patent are hereby corrected as shown below:

Column 11, line 9, "750°c" should read -- 750°C --.

, line 64, "out" should read -- but --.

Column 13, line 63, "electrod" should read -- electrode --.

Column 15, line 58, "hve" should read -- have --.

Column 23, Claim 42, line 45, "of at least 50%" should read -- of at least about 50% --.

Signed and Sealed this

Twenty-fifth Day of April 1978

[SEAL]

Attest:

RUTH C. MASON
Attesting Officer

LUTRELLE F. PARKER
Acting Commissioner of Patents and Trademarks